United States Patent
Nishimura et al.

(10) Patent No.: US 7,705,322 B2
(45) Date of Patent: Apr. 27, 2010

(54) CHARGED-PARTICLE BEAM WRITING METHOD

(75) Inventors: Rieko Nishimura, Kanagawa (JP); Takashi Kamikubo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 131 days.

(21) Appl. No.: 12/170,874

(22) Filed: Jul. 10, 2008

(65) Prior Publication Data

US 2009/0014663 A1 Jan. 15, 2009

(30) Foreign Application Priority Data

Jul. 12, 2007 (JP) ............................. 2007-183037
Jun. 10, 2008 (JP) ............................. 2008-151552

(51) Int. Cl.
*H01J 37/302* (2006.01)

(52) U.S. Cl. ............................. 250/396 R; 250/492.22; 250/398

(58) Field of Classification Search ............. 250/396 R, 250/492.22, 398
See application file for complete search history.

(56) References Cited

U.S. PATENT DOCUMENTS 6,376,848 B1 * 4/2002 Minami ................ 250/492.22
6,407,398 B1 * 6/2002 Kurokawa et al. ...... 250/492.22

FOREIGN PATENT DOCUMENTS

| JP | 8-250394 | 9/1996 |
|----|----------|--------|
| JP | 10-256122 | 9/1998 |
| JP | 10-284392 | 10/1998 |

* cited by examiner

*Primary Examiner*—Kiet T Nguyen
(74) *Attorney, Agent, or Firm*—Oblon, Spivak, McClelland, Maier & Neustadt, L.L.P.

(57) ABSTRACT

The present invention provides an electron beam writing method capable of suppressing a variation in position to be irradiated with an electron beam due to its drift and writing a predetermined pattern.

A positional displacement amount near the center of each main deflection area of the charged-particle beam is determined. Correction values are determined from a plurality of the positional displacement amounts. A position irradiated with the charged-particle beam is corrected from the correction values. The neighborhood of the center of the main deflection area can be a sub deflection area including the center of the main deflection area. In this case, the positional displacement amount can be one for one arbitrary point in the sub deflection area. Alternatively, the positional displacement amount can also be the average of positional displacement amounts at a plurality of arbitrary points in the sub deflection area.

9 Claims, 11 Drawing Sheets

CHARGED-PARTICLE BEAM WRITING METHOD

BACKGROUND OF THE INVENTION

1. Field of the Invention

The present invention relates to a charged-particle beam writing method, and more specifically to a pattern writing method with a charged-particle beam in which the charged-particle beam is deflected using a main deflector and a sub deflector both disposed on the optical path of the charged-particle beam and a predetermined pattern is written onto a sample located on a stage.

2. Background Art

FIG. 11 is the schematic configuration of an electron beam writing system disclosed in Japanese patent laid-open No. 284392/1998 (Hei 10-284392). In the figure, a stage 103 with a sample 102 such as a mask mounted thereon is accommodated inside a sample chamber 101. The stage 103 is driven by a stage driving circuit 104 in the direction of X (direction horizontal to this sheet) and in the direction of Y (obverse-reverse direction of the sheet). The moved position of the stage 103 is measured by a position or location circuit 105 using a laser length measurement unit or the like.

An electron beam optical system 1010 is disposed above the sample chamber 101. The electron beam optical system 1010 is made up of an electron gun 106, various lenses 107, 108, 109, 1011 and 1012, a blanking deflector 1013, a beam size varying deflector 1014, a main deflector 1015 for beam scanning, a sub deflector 1016 for beam scanning, and two beam shaping apertures 1017 and 1018, etc.

A position to be irradiated with an electron beam is positioned in a predetermined subfield by the main deflector 1015. A pattern writing position is located within the subfield by the sub deflector 1016. The beam size varying deflector 1014 and the beam shaping apertures 1017 and 1018 control the shape of the electron beam. Pattern writing processing in the subfield is conducted by moving the stage 103 continuously in one direction. At this time, the processing proceeds to exposure of the next subfield after the completion of exposure of one subfield.

After the end of drawing of a frame corresponding to a set of a plurality of subfields, the stage 103 is moved in steps in the direction perpendicular to the direction of its continuous movement. By repeating the above processing, respective frame areas are written sequentially. Here, the frame is a strip-like pattern writing area determined depending on the deflection width of the main deflector 1015. On the other hand, the subfield is a unitary pattern writing area determined depending on the deflection width of the sub deflector 1016.

A magnetic disk 1021 corresponding to a storage medium is connected to a control computer 1020. Pattern writing data for a mask is stored in the magnetic disk 1021. The pattern writing data read from the magnetic disk 1021 is temporarily stored for each frame area in a pattern memory 1022. The pattern data for each frame area stored in the pattern memory 1022, or frame information comprising a pattern writing position, pattern writing graphic data, etc. is analyzed by a pattern data decoder 1023 and a pattern writing data decoder 1024 each corresponding to a data analysis section.

The output of the pattern data decoder 1023 is sent to a blanking circuit 1025 and a beam shaping driver 1026. That is, the pattern data decoder 1023 creates blanking data, based on the above data and sends the same to the blanking circuit 1025. Further, desired beam size data is also created and sent to the beam shaping driver 1026. A predetermined deflection signal is applied from the beam shaping driver 1026 to the beam size varying deflector 1014 of the electron optical system 1010, whereby the size of the electron beam is controlled.

The output of the pattern writing data decoder 1024 is sent to a main deflection sensitivity correcting unit 1031. The main deflection sensitivity correcting unit 1031 performs a sensitivity correction to a main deflector driver 1027 according to a main deflection position (subfield pattern writing position) in the frame and sends the corrected data to the main deflector driver 1027 and a sub deflection sensitivity correcting unit 1032. The sub deflection sensitivity correcting unit 1032 transfers the optimum sub deflection sensitivity for the main deflection position corrected by the main deflection sensitivity correcting unit 1031 to a sub deflector driver 1028. Here, the corrected data of the main deflection sensitivity correcting unit 1031 and the sub deflection sensitivity correcting unit 1032 are determined upon deflection/calibration of an electron beam prior to actual pattern writing and stored in their corresponding memories attached thereto in advance by the control computer 1020. Incidentally, the corrected data of the sub deflection sensitivity correcting unit 1032 is created by detecting a sensitivity shift in sub deflection produced depending on the main deflection position in advance.

A predetermined deflection signal is applied from the main deflector driver 1027 to the main deflector 1015 of the electron optical system 1010 to deflect and scan the electron beam in a designated main deflection position. The sub deflection sensitivity correcting unit 1032 generates a control signal for sub deflector scanning and sends it to the sub deflector driver 1028. Then, a predetermined sub deflection signal is applied from the sub deflector driver 1028 to the sub deflector 1016, whereby pattern writing inside each subfield is performed.

In such an electron beam writing system, bending due to own weight of the mask occurs in the mask with the mask mounted on the stage. In doing so, each pattern formed onto the mask is distorted so that a desired pattern cannot be formed. With the foregoing in view, Japanese patent laid-open No. 250394/1996 (Hei 8-250394) has disclosed that a signal obtained by applying an electron beam to a mask is detected to obtain positional information about each pattern formed on the mask, the height of the surface of the mask is measured to determine or obtain bending of the mask, and the positional information about the pattern is corrected based on the so-obtained bending.

In the Japanese patent laid-open No. 250394/1996 (Hei 8-250394), the amounts of position corrections in the directions of X and Y caused by the bend of the mask are calculated by determining coefficients of a function descriptive of a surface shape by the method of least squares. Described specifically, assuming that data obtained by measuring the height at a plurality of different positions are used and the height measured relative to a position (x, y) on the mask is z, the surface shape is represented by coefficients $a_0$ through $a_{14}$ of a function constituted of the following equation:

$$z = a_0 + a_1 x + a_2 y + a_3 x^2 + a_4 xy + a_5 y^2 + a_6 x^3 + a_7 x^2 y + a_8 xy^2 + a_9 y^3 + a_{10} x^4 + a_{11} x^3 y + a_{12} x^2 y^2 + a_{13} xy^3 + a_{14} y^4$$

However, the method of calculating a correction value at an arbitrary point (x, y) of a pattern writing area by the electron beam on the basis of one function is unfit where the correction amount increases locally at part of the pattern writing area.

Therefore, Japanese patent laid-open No. 256122/1998 (Hei 10-256122) has described that a pattern writing area is divided into plural areas and the correction of pattern writing positions in the areas are performed independently of each other.

SUMMARY OF THE INVENTION

However, the prior art method using the function has encountered difficulties in obtaining an accurate value because, though the correction coefficients are often calculated inclusive of the variation due to the drift, the drift changes as needed.

The present invention has been made in view of such points. That is, an object of the present invention is to provide an electron beam writing method capable of suppressing a variation in the position irradiated with an electron beam due to drift and thereby writing a desired pattern.

According to one aspect of the present invention, in a charged-particle beam writing method for deflecting a charged-particle beam using a main deflector and a sub deflector disposed on an optical path of the charged-particle beam and writing a predetermined pattern onto a sample located on a stage, positional displacement amounts are determined in the neighborhood of the center of a main deflection area of the charged-particle beam. Correction values are determined from a plurality of said positional displacement amounts. And a position to be irradiated with the charged-particle beam is corrected using the correction values.

According to another aspect of the present invention, in a charged-particle beam writing method for deflecting a charged-particle beam using a main deflector and a sub deflector disposed on an optical path of the charged-particle beam and writing a predetermined pattern onto a sample located on a stage, positional displacement amounts are determined in the entire range of a main deflection area of the charged-particle beam and determining first correction values are determined from said positional displacement amounts. A second correction value, or the average value of the first correction values is determined. And a position to be irradiated with the charged-particle beam is corrected using the correction values.

According to other aspect of the present invention, in a charged-particle beam writing method for deflecting a charged-particle beam using a main deflector and a sub deflector disposed on an optical path of the charged-particle beam and writing a predetermined pattern onto a sample located on a stage, positional displacement amounts are determined at multiple arbitrary points in a main deflection area of the charged-particle beam and determining first correction values are determined from said positional displacement amounts. A second correction value, or the average value of the first correction values is determined. And a position to be irradiated with the charged-particle beam is corrected using the second correction value.

Other objects and advantages of the present invention will become apparent from the following description.

DETAILED DESCRIPTION OF THE PREFERRED EMBODIMENTS

Figure 1:
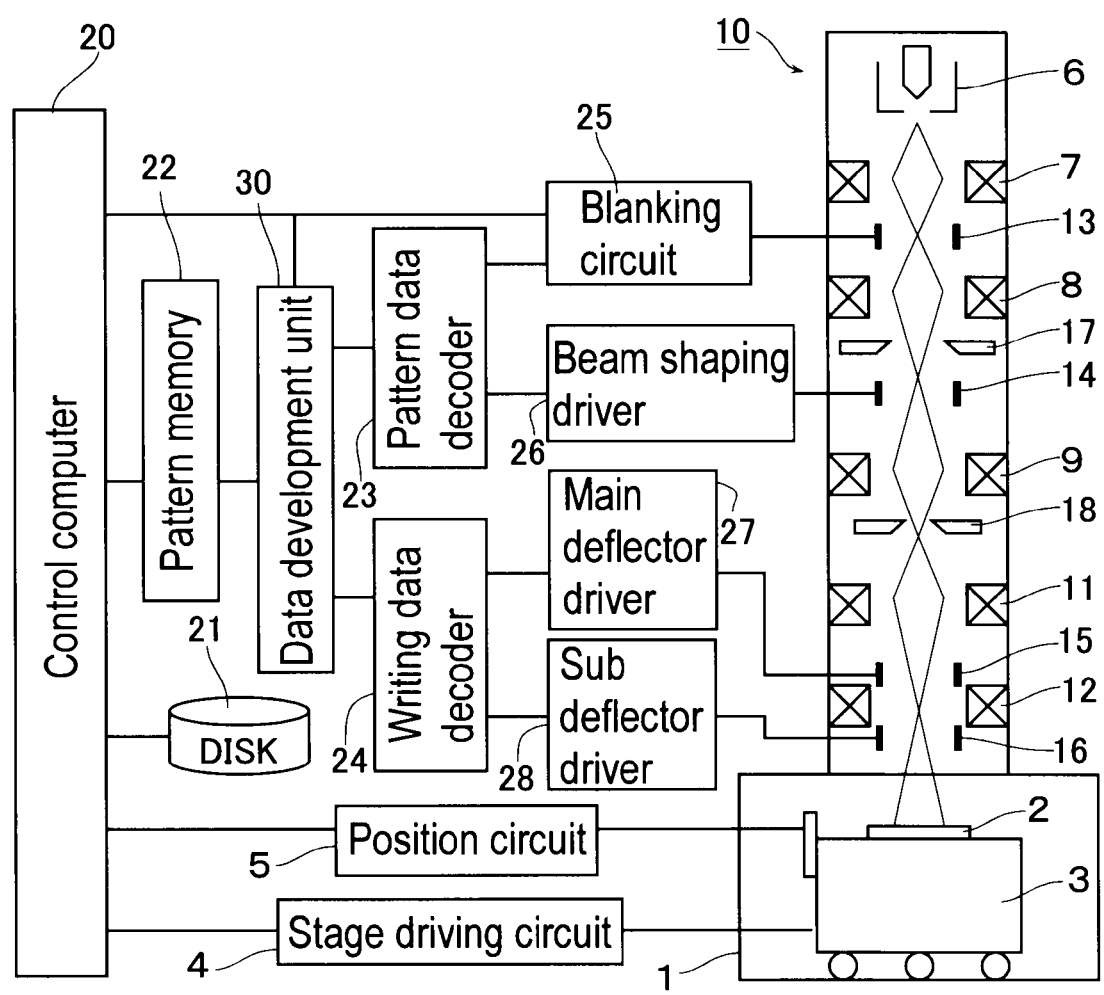
FIG. 1 is a configuration diagram of an electron beam writing system according to the present embodiment.

FIG. 1 is a configuration diagram of an electron beam writing system according to the present embodiment.

In FIG. 1, a stage 3 with a mask 2 corresponding to a sample mounted thereon is accommodated in a sample chamber 1. The stage 3 is driven by a stage driving circuit 4 in the direction of x (direction parallel to the sheet) and in the direction of y (direction vertical to the sheet). The moved position of the stage 3 is measured by a position circuit 5 using a laser length measurement unit or the like.

An electron beam optical system 10 is disposed on the mask 2. The electron beam optical system 10 has an electron gun 6, various lenses 7, 8, 9, 11 and 12, a blanking deflector 13, a beam size varying deflector 14, a main deflector 15 for beam scanning, a sub deflector 16 for beam scanning, and beam shaping apertures 17 and 18. The main deflector 15 positions an electron beam in a predetermined subfield. On the other hand, the sub deflector 16 performs positioning of graphics writing units within the subfield. The beam size varying deflector 14 and the beam shaping apertures 17 and 18 serve so as to control the shape of the beam.

In electron-beam pattern writing steps, the stage 3 is first moved continuously in one direction to perform pattern writing processing on frame areas divided into strip forms according to the deflection width of the main deflection beam. Next, the stage 3 is moved in steps in the direction perpendicular to the above direction to perform pattern writing processing in the same manner as described above. By repeating the above, the respective frame areas are sequentially written.

In FIG. 1, a magnetic disk 21 is connected to a control computer 20. Here, pattern writing data of LSI has been stored in the magnetic disk 21. The pattern writing data read from the magnetic disk 21 is temporarily stored for each frame area in a pattern memory 22. The pattern data for each frame area stored in the pattern memory 22, or frame information comprising pattern writing position, graphic data, etc. is analyzed by a pattern data decoder 23 and a pattern writing data decoder 24 each corresponding to a data analysis section, followed by being transmitted to a blanking circuit 25, a beam shaping driver 26, a main deflector driver 27 and a sub deflector driver 28.

The pattern data decoder 23 inputs pattern writing data therein and effects reversal processing on the graphic data contained in each frame area as needed to produce or generate reversal pattern data. Next, the pattern data decoder 23 graphically divides the graphic data defined as the frame data into unitary pattern-writing graphic groups that can be written by a combination of the beam shaping apertures 17 and 18. Based on the so-obtained data, blanking data is generated and sent to the blanking circuit 25. Then, the desired beam size data is generated and sent to the beam shaping driver 26. Next, a predetermined deflection signal is transmitted from the beam shaping driver 26 to the beam size varying deflector 14 of the electron beam optical system 10, whereby the size of the electron beam is controlled.

The pattern writing data decoder 24 generates data for positioning subfields, based on the frame data. The so-obtained data is sent to the main deflector driver 27. Then, a predetermined signal is transmitted from the main deflector driver 27 to the main deflector 15 of the electron beam optical system 10, where the electron beam is deflected and scanned at a designated subfield position. The pattern writing data decoder 24 generates a sub deflector scanning control signal and transmits it to the sub deflector driver 28. Then, a predetermined sub deflection signal is sent from the sub deflector driver 28 to the sub deflector 16, so that pattern writing for each subfield is performed.

In FIG. 1, the sub deflector 16 is used to control the position of the electron beam at high speed and with high-precision. Therefore, the range of deflection of the sub deflector 16 is limited to each subfield on the mask 2. When the deflection exceeds this range, it is necessary to move the position of the subfield by the main deflector 15. Thus, the main deflector 15 is used to control the position of the subfield and is capable of moving the subfield within a main deflection area. Here, the main deflection area indicates an area deflectable by the main deflector 15. Since the stage 3 is moved continuously in one direction during pattern writing, the main deflector 15 keeps track of the pattern writing origin of a sub field for the origin to follow the movement of the stage 3.

Figure 2:
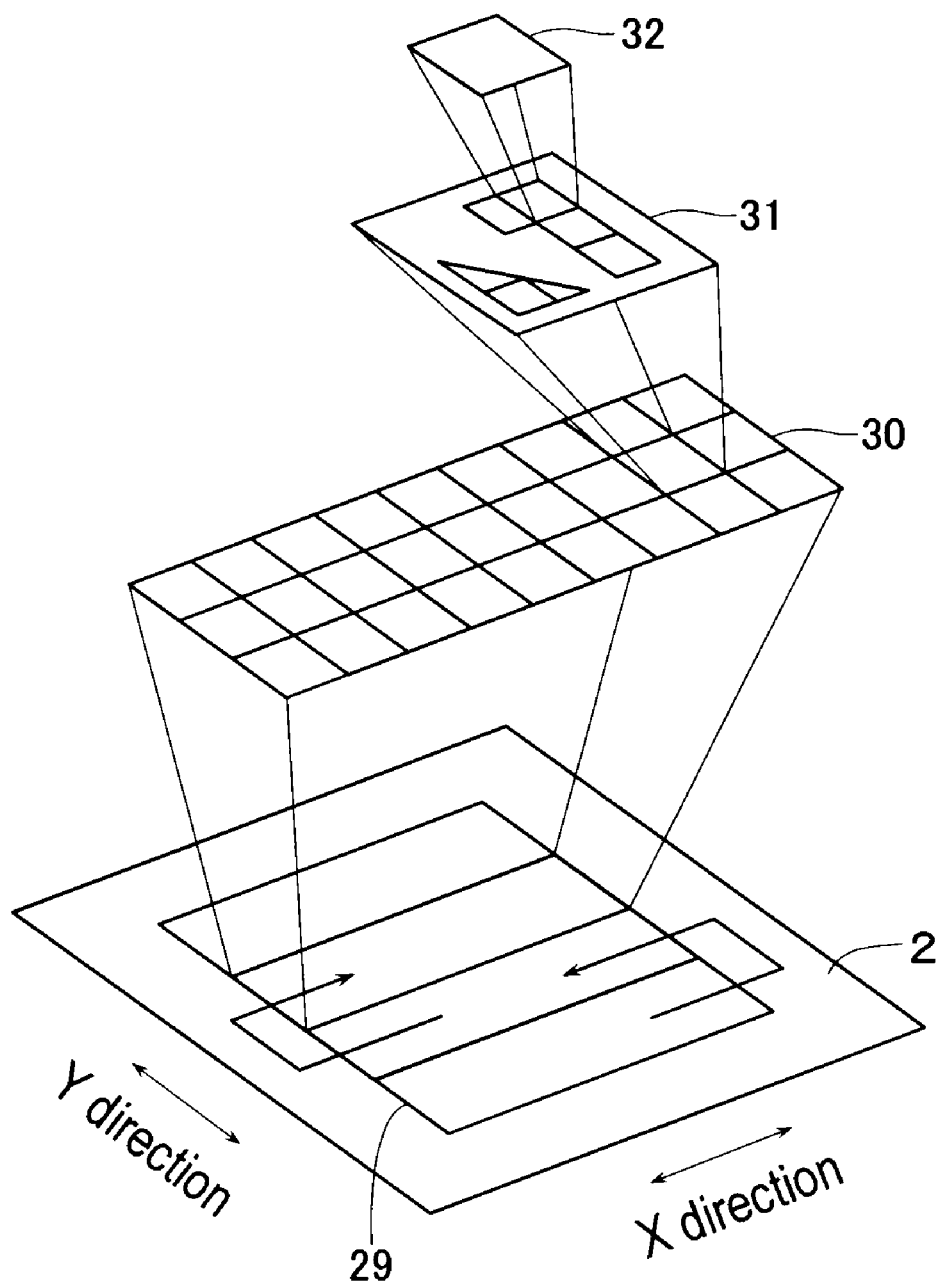
FIG. 2 is a diagram of pattern writing with an electron beam.

Thus, the electron beam formed at the beam shaping apertures 17 and 18 is deflected by the main deflector and the sub deflector and the position to apply the electron beam is determined while following the stage 3 moved continuously. FIG. 2 is a diagram for describing the manner thereof. In FIG. 2, reference numeral 30 indicates a main deflection area (frame), reference numeral 31 indicates a sub deflection area (subfield), and reference numeral 32 indicates a shot graphic form. As shown in the figure, a stripe area 29 is first plotted by the electron beam while the stage (not shown) is being moved in the direction of X. Then, the stage is conveyed in steps in the direction of Y to draw the following stripe area 29. By repeating this processing, pattern writing can be effected over the entire surface of the sample. By moving the stage in the direction of X continuously and causing the shot position of the electron beam to follow the movement of the stage, the pattern writing time can be shortened. In the present embodiment, however, a step-and-repeat lithographic method may be adopted which performs pattern writing for one main deflection area in a stage halting state and does not perform pattern writing when the stage is moved to the next area.

The features of the pattern writing method according to the present embodiment will next be explained.

A correction amount at an arbitrary point of each pattern writing area by the electron beam is calculated by determining each coefficient of a function descriptive of the surface shape of a mask by the method of least squares, for example. Described specifically, the height of a mask surface is measured at a plurality of different positions on the mask. Using a detection function (autofocus function) for raising or lowering an objective lens in the direction of height of the mask on the mask to obtain focusing automatically, the height of the mask surface is detected from the position of the objective lens at the time that focus is achieved at a predetermined position. In the present embodiment, the correction amount is determined in consideration of even bending of a stage mirror fixed to the end of the stage to perform the positioning of the stage in addition to the surface shape of the mask.

Assuming that a pattern writing position having taken into consideration each correction coefficient calculated using the method of least squares is (x', y') with respect to a designated position of pattern writing (x, y) on the mask, x' and y' are respectively expressed in the following equations:

$$x' = a_0 + a_1 x + a_2 y + a_3 x^2 + a_4 xy + a_5 y^2 + a_6 x^3 + a_7 x^2 y +$$
$$a_8 xy^2 + a_9 y^3 + a_{10} x^4 + a_{11} x^3 y + a_{12} x^2 y^2 + a_{13} xy^3 + a_{14} y^4$$
$$y' = b_0 + b_1 x + b_2 y + b_3 x^2 + b_4 xy + b_5 y^2 + b_6 x^3 + b_7 x^2 y + b_8 xy^2 +$$
$$b_9 y^3 + b_{10} x^4 + b_{11} x^3 y + b_{12} x^2 y^2 + b_{13} xy^3 + b_{14} y^4$$

Assuming that the height of the mask surface at the point (x, y) on the mask is z, the height z' at the point (x', y') is expressed in the following equation. Incidentally, z' is a value on which the bending of the stage mirror fixed to the end of the stage to perform positioning of the stage is reflected in addition to bending of the mask.

$$z' = c_0 + c_1 x + c_2 y + c_3 x^2 + c_4 xy + c_5 y^2 + c_6 x^3 + c_7 x^2 y + c_8 xy^2 + c_9 y^3 +$$
$$c_{10} x^4 + c_{11} x^3 y + c_{12} x^2 y^2 + c_{13} xy^3 + c_{14} y^4$$

Figure 3:
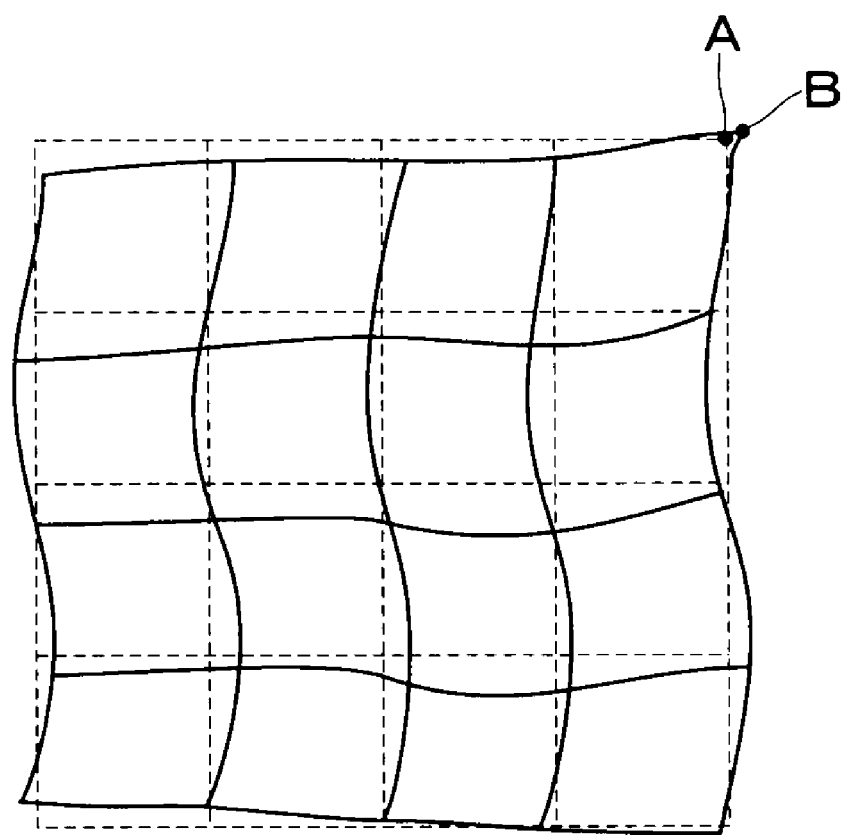
FIG. 3 is a diagram for describing how to give a correction amount.

FIG. 3 is a diagram for describing how to give the correction amount. In the figure, A is a lattice point indicative of an ideal position for pattern writing, and B is a lattice point to be given by the above correction using the computation. Thus, in the present embodiment, the pattern writing area on the sample is divided into a plurality of areas, and correction amounts are respectively applied to the divided areas independently of each other. According to the present method, degradation in correction accuracy at the time that the amount of correction increases locally can be suppressed as compared with a method for calculating a correction amount for the entire pattern writing area, based on one function.

Figure 4:
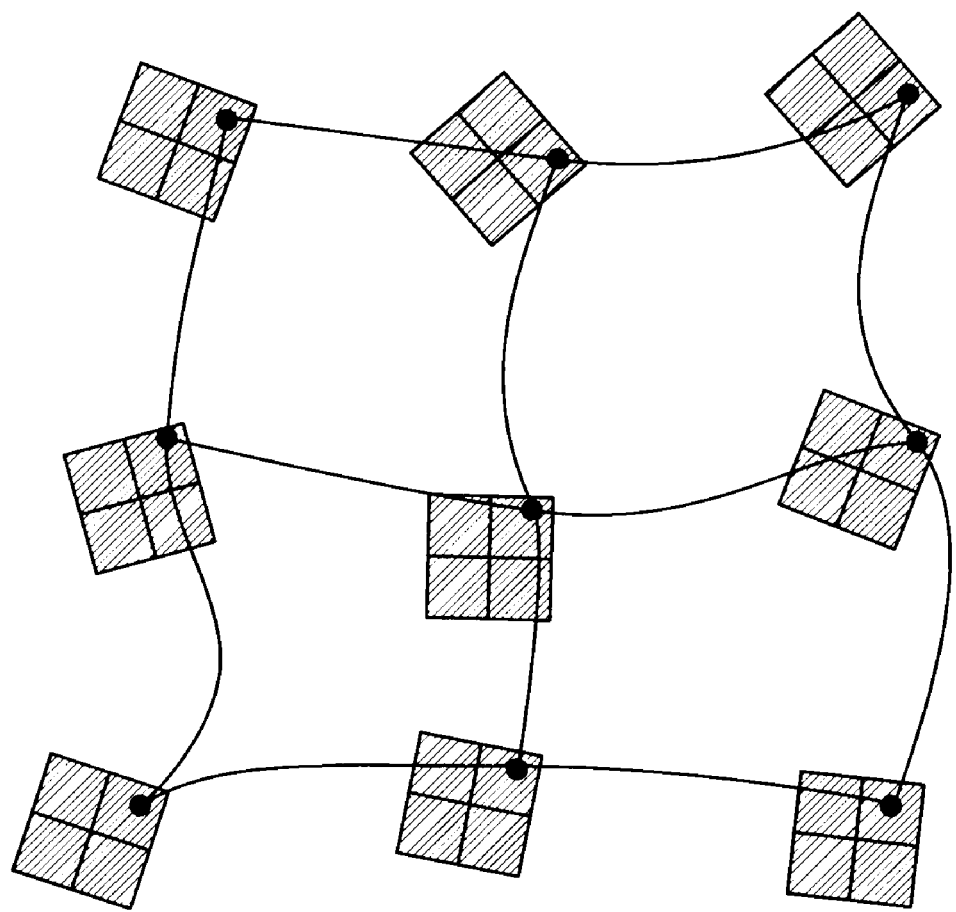
FIG. 4 is a diagram illustrating lattice points to be given according to the correction taken where drift has occurred.

The above correction contains positional variations produced by the drift of an electron beam due to temporal factors (hereinafter simply referred to as drift). FIG. 4 is one example illustrative of lattice points to be given according to the correction taken where drift has occurred. In FIG. 4, main deflection area portions in the neighborhood of the respective lattice points are shown to provide easy understanding. It is understood from this figure that variations occur in the main deflection areas due to the drift. Specifically, each of the main deflection areas is rotated and expanded/contracted from the ideal position.

Figure 5:
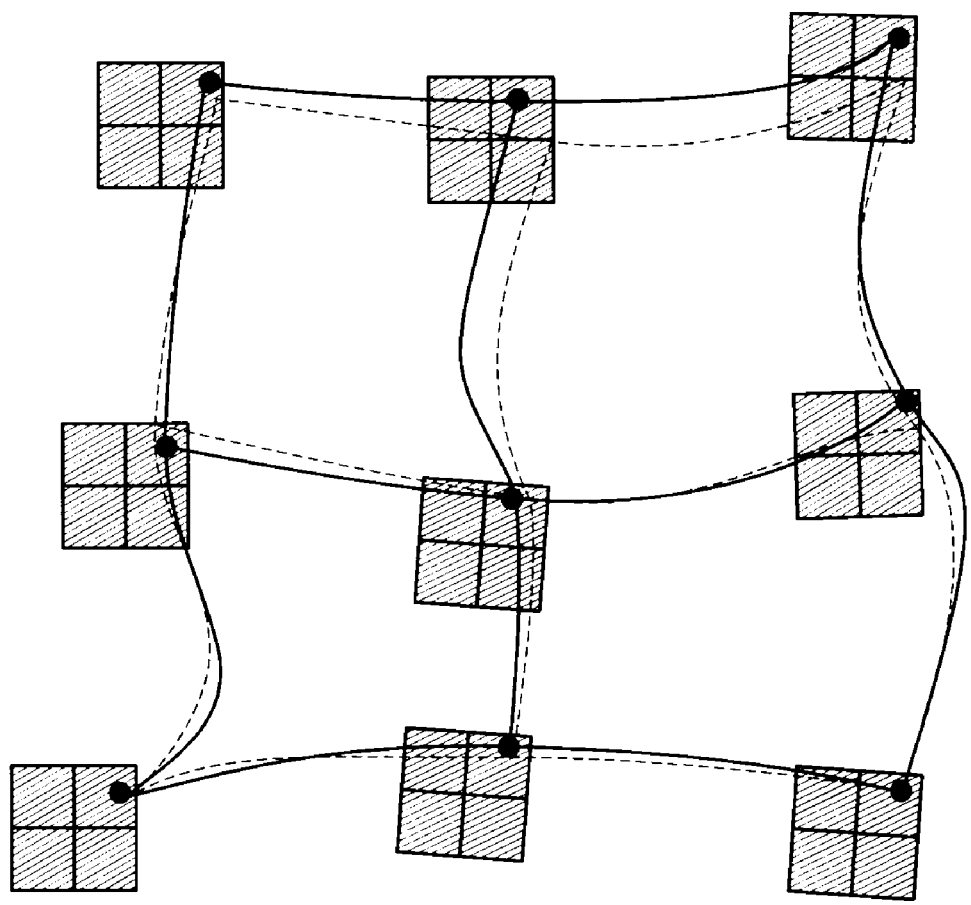
FIG. 5 is a diagram illustrating lattice points to be given according to the correction taken where drift has not occurred.

FIG. 5 is another example using an electron beam writing system similar to FIG. 4. A solid line is equivalent to one formed by connecting lattice points to be given by corrections to one another. The same line as FIG. 4 is shown by the dotted line.

FIG. 5 corresponds to the case in which no rotation and expansion/contraction occur in the main deflection areas and no drift occurs. Comparing between the solid line and the dotted line shows a difference in the amount of correction depending on the presence or absence of the occurrence of the drift. Accordingly, the mere correction including the variations produced due to the drift gives no consideration to the amount of variation in drift and results in degradation in the accuracy of the correction.

Comparing the positions of the lattice points where the drift occurs and the positions of the lattice points where no drift occurs, it is understood in FIG. 5 that the amounts of displacements of the two are different depending on the positions of the main deflection areas. Described specifically, the amount of positional displacement at the corner of each main deflection area is large, whereas the amount of positional displacement in the neighborhood of the center of the main deflection area is small. That is, the neighborhood of the center of each main deflection area is hard to be susceptible to the amount of variation in drift. That is, even though the rotation and expansion/contraction occur in the main deflection area, the displacement produced in the neighborhood of the center thereof is smaller than that produced at the corner thereof. Thus, if a correction coefficient is calculated in the neighborhood of the center of the main deflection area, specifically, at each sub deflection area including the neighborhood of the center of the main deflection area, then the influence due to the amount of variation in drift can be suppressed, thereby making it possible to realize a high-precision correction.

Figure 6:
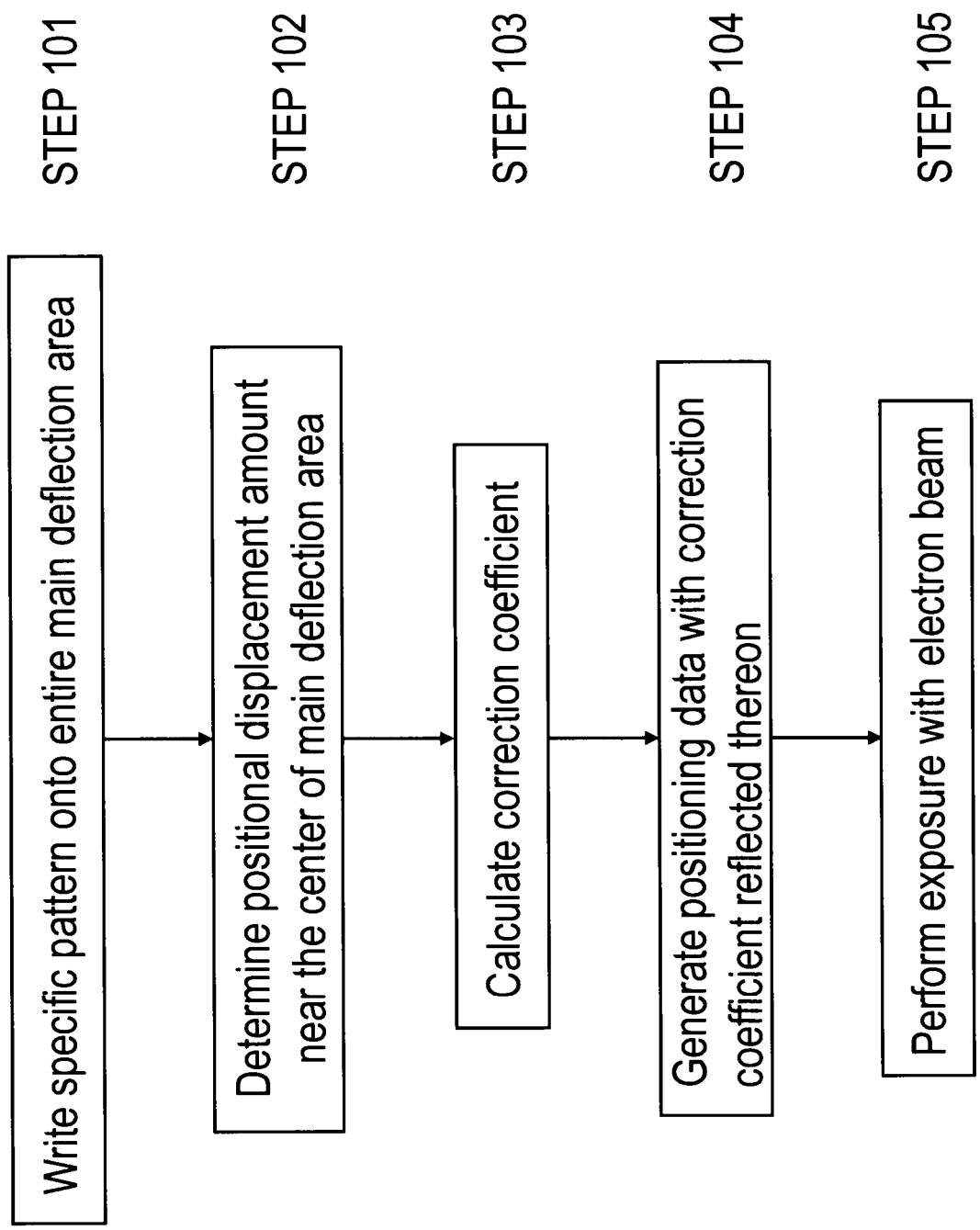
FIG. 6 is one example of a flowchart showing an electron beam writing method according to the present embodiment.

FIG. 6 is a flowchart showing an electron beam writing method according to the present embodiment.

A specific pattern is written over the entire main deflection area of a mask by an electron beam in accordance with a step-and-repeat system (Step 101). Incidentally, it may be written onto only an area including the neighborhood of the center of the main deflection area by a continuous movement system.

Next, the amount of displacement in position between the position irradiated with the electron beam and an ideal irradiation position is determined at a point (x, y) located in the neighborhood of the center of the main deflection area formed at Step 101 (Step 102). Incidentally, in the present embodiment, the neighborhood of the center of the main deflection area can be taken as a sub deflection area including the center of the main deflection area. In this case, the amount of displacement in position can also be defined as one for one arbitrary point in the sub deflection area including the center of the main deflection area. Alternatively, the amount of displacement in position can also be taken as the average of the amounts of displacements in position at a plurality of arbitrary points in the sub deflection area including the center of the main deflection area. Further, the amount of displacement in position can also be taken as the average of the amounts of displacements in position at a plurality of arbitrary points in the sub deflection area including the center of the main deflection area and four sub deflection areas that are located therearound.

The processing of Step 102 is performed on a plurality of main deflection areas on the mask. Since it takes time to perform the processing though the accuracy of correction becomes higher as the number of processes increases, the number thereof may be set to a suitable number of processes as the case may be. Correction coefficients are calculated from the plural amounts of displacements in position obtained at Step 102 (Step 103).

The processing of Step 102 is performed by measuring the mask already subjected to pattern writing using a measuring instrument and calculating the amount of displacement in position from each obtained value. After the calculation of each correction coefficient, the pattern writing data decoder 24 generates data for positioning subfields, on which the correction coefficients are reflected (Step 104). The thus-obtained data is transmitted to the main deflector driver 27 and the sub deflector driver 28 respectively.

Then, pattern writing with the electron beam is performed based on the transmitted data (Step 105). Described specifically, a predetermined signal is transmitted from the main deflector driver 27 to the main deflector 15 of the electron beam optical system 10, where the electron beam is deflected and scanned at a designated subfield position. A predetermined sub deflection signal is sent from the sub deflector driver 28 to the sub deflector 16, whereby pattern writing for each subfield is performed.

The pattern writing is performed on its corresponding stripe area while the stage is being moved in the direction of X. Then, the stage is conveyed in steps in the direction of Y and thereafter the pattern writing is performed on the next stripe area. At this time, such a continuous movement system that the stage is moved continuously in the direction of X and the shot position of the electron beam is caused to follow the movement of the stage can be adopted for the movement of the stage. Such a step-and-repeat system that the stage is stopped to perform pattern writing for one main deflection area and no pattern writing is performed when the stage is stepped to the next area can also be adopted therefor.

The step-and-repeat system may preferably be adopted in terms of the enhancement of pattern writing accuracy. When the continuous movement system is taken, it is preferable to write patterns with the width of a main deflection area narrowed. Described in detail, it is preferable to set each main deflection area to a width obtained by combining a first sub deflection area lying in the neighborhood of the center of a main deflection area and two of second sub deflection areas with one located anteriorly and the other located posteriorly in the movement direction of the stage with the first sub deflection area positioned therebetween and thereby perform the irradiation with the electron beam. In doing so, pattern writing can always be performed in the neighborhood of the center of the main deflection area. Incidentally, when the center of the main deflection area lies between the two sub deflection areas, the main deflection area is set to a width obtained by combining these sub deflection areas and sub deflection areas located three or so respectively before and after these sub deflection areas in the direction of movement of the stage. In such a state, the irradiation with the electron beam may preferably be performed.

In the present embodiment, correction coefficients in the entire range of a main deflection area and a correction amount based on those values may be determined, whereby pattern writing can also be performed. This method is effective where large distortion occurs in the shape of the main deflection area. The above method will be explained using a flowchart shown in FIG. 7.

Figure 10:
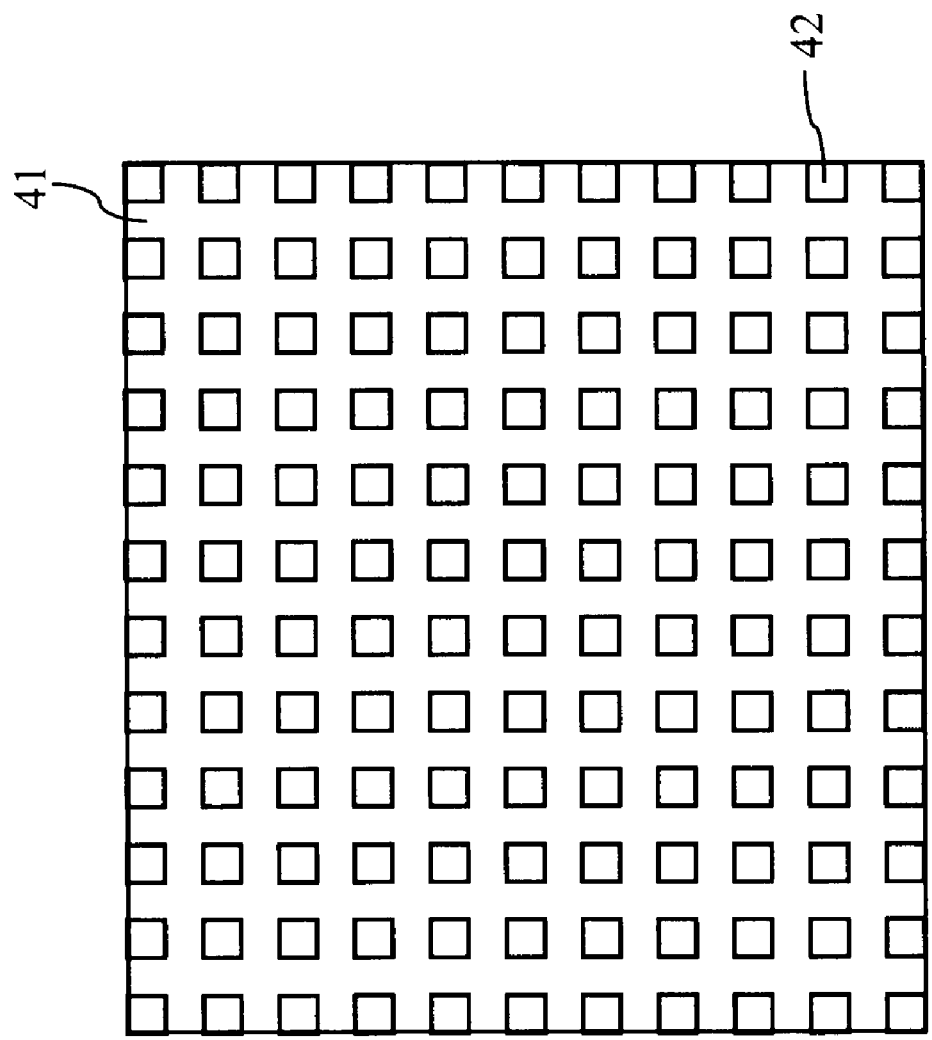
FIG. 10 is an exemplary pattern to be written in a main deflection area according to the present embodiment.
Figure 11:
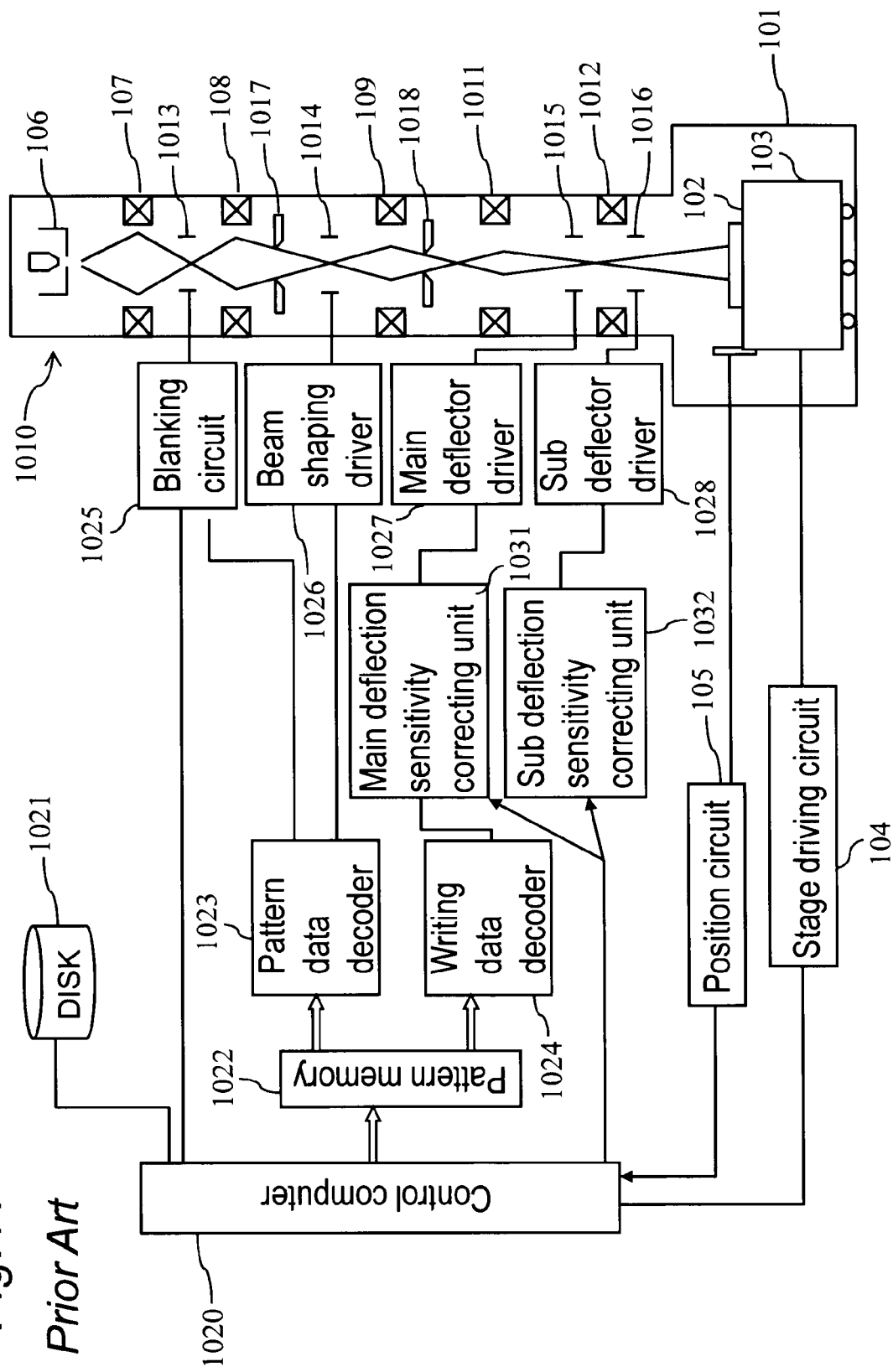
FIG. 11 is a configuration diagram of an existing electron beam writing system.

A specific pattern is first written onto the entire main deflection area of a sample by an electron beam in accordance with the step-and-repeat system (Step 201). For example, patterns such as the ones shown in FIG. 10 are written. In FIG. 10, patterns 42 are placed at regular intervals over the entire main deflection area 41. In the central coordinates of each of the patterns 42, the x coordinate and the y coordinate take the same value, that is, the x-directional distance and the y-directional distance are equidistant from the origin. After the patterns 42 shown in FIG. 10 are written with an electron beam, the central coordinates are measured with the use of a coordinate measuring instrument. This measurement gives the information on the actual shape of the main deflection area.

Next, the amount of displacement in position between the position irradiated with the electron beam and an ideal irradiation position is determined in the entire range of the main deflection area formed in Step 201 (Step 202).

The processing of Step 202 is performed on a plurality of main deflection areas on the mask. Since it takes time to perform the processing though the accuracy of correction becomes higher as the number of processes increases, the number thereof may be set to a suitable number of processes as the case may be. First correction coefficients are calculated from the plural amounts of displacements in position obtained at Step 202 (Step 203).

Next, the average value of the first correction coefficients obtained in Step 203, or a second correction coefficient, is calculated (Step 204). The second correction coefficient is to correct the distortion in the shape of the main deflection area.

The process of Step 202 is performed by measuring the mask already subjected to pattern writing by means of the measuring instrument and calculating the amounts of displacements in position from values obtained by the measurement. After the calculation of the necessary correction coefficients at these steps, the pattern writing data decoder 24 generates data for positioning subfields, on which the second correction coefficient has been reflected (Step 205). The thus-obtained data is transmitted to the main deflector driver 27 and the sub deflector driver 28, respectively.

Subsequently, pattern writing with the electron beam is performed based on the transmitted data (Step 206). Described specifically, a predetermined signal is sent from the main deflector driver 27 to the main deflector 15 of the electron beam optical system 10, where the electron beam is deflected and scanned at a designated subfield position. A predetermined sub deflection signal is sent from the sub deflector driver 28 to the sub deflector 16, whereby pattern writing for each subfield is performed.

Figure 7:
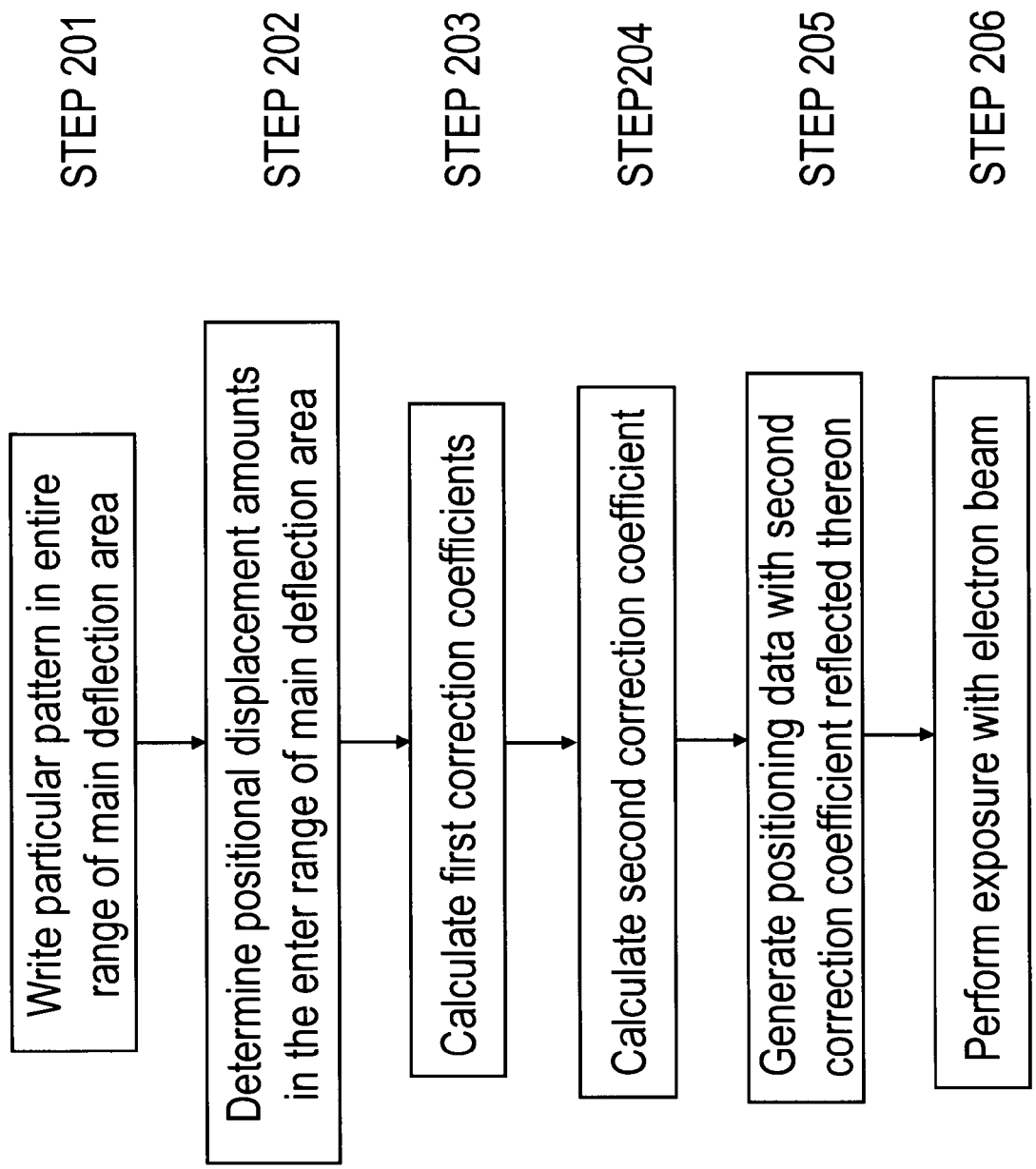
FIG. 7 is another example of a flowchart showing an electron beam writing method according to the present embodiment.

According to the method shown in FIG. 7, pattern writing higher in precision than the method shown in FIG. 6 is enabled since the correction coefficients are calculated in the entire range of a main deflection area. Thus, it is possible to perform pattern writing by the continuous movement system with no need to narrow the width of the main deflection area and realize processing at high speed. Also possible is a method in which positional displacement values are obtained at multiple arbitrary points in a main deflection area to determine the first correction values based on those values, and the second correction value, i.e., the average value of the first correction values, is thereafter obtained to correct the position to be irradiated with an electron beam based on the second correction value. This method also enables pattern writing with great precision. In addition, the method can reduce the calculation time, compared with the above case where correction coefficients in the entire range of a main deflection area are obtained, thereby enabling faster correction processing.

FIGS. 6 and 7 respectively have explained the methods for calculating the correction amount using the functions. The present embodiment is however not limited to the methods. A map related to each position irradiated with an electron beam is created and a correction amount may be determined by this map. An electron beam writing method based on this method will be described using FIGS. 8 and 9.

Figure 8:
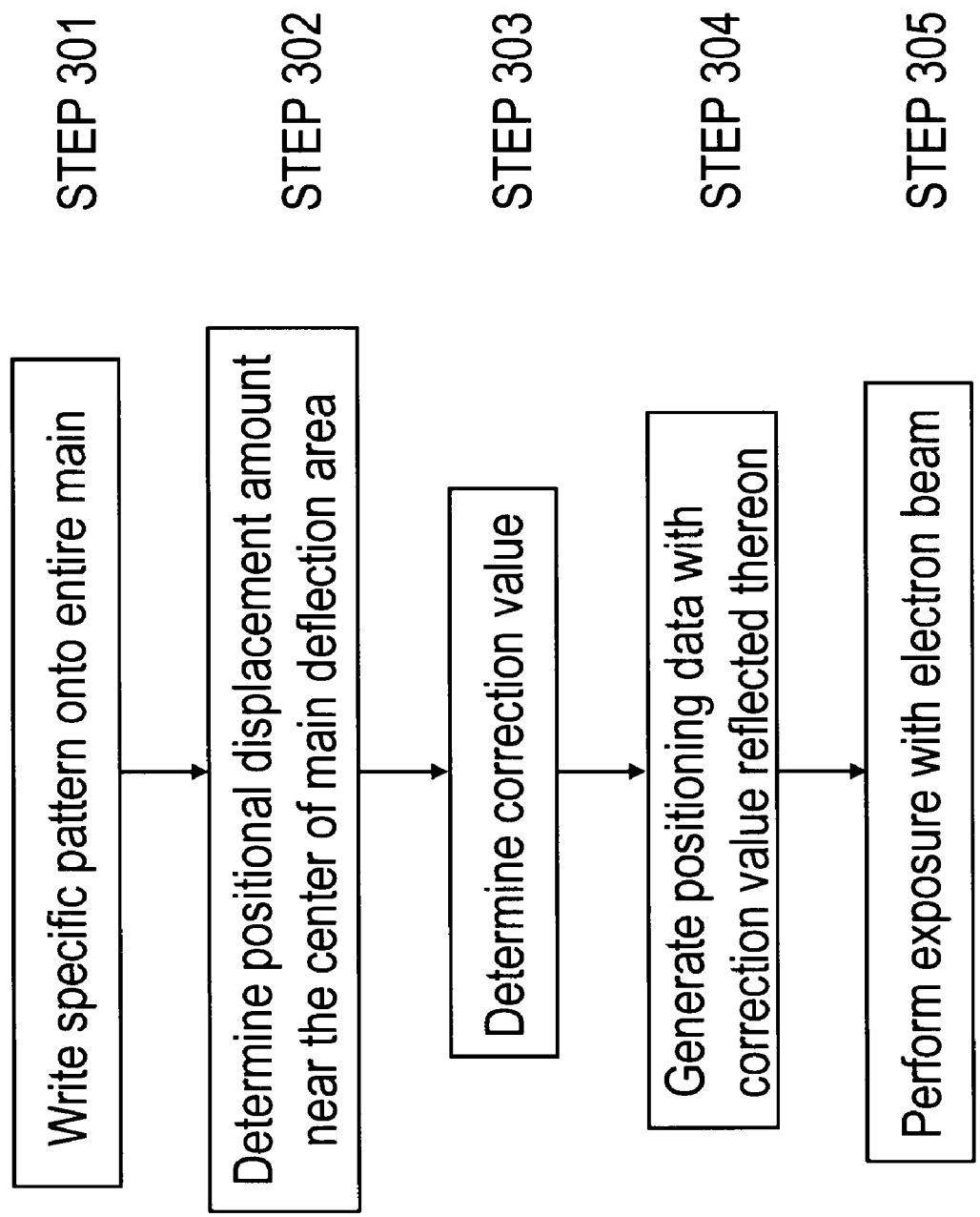
FIG. 8 is another example of a flowchart showing an electron beam writing method according to the present embodiment.

In FIG. 8, a specific pattern is first written onto the entire main deflection area of a sample by an electron beam in accordance with the step-and-repeat system (Step 301). Incidentally, it may be written onto only an area including the neighborhood of the center of a main deflection area by a continuous movement system.

Next, the amount of displacement in position between the position irradiated with the electron beam and an ideal irradiation position is determined at a point (x, y) located in the neighborhood of the center of the main deflection area formed at Step 301 (Step 302). Incidentally, in the present embodiment, the neighborhood of the center of the main deflection area can be taken as a sub deflection area including the center of the main deflection area. In this case, the amount of displacement in position can also be defined as one for one arbitrary point in the sub deflection area including the center of the main deflection area. Alternatively, the amount of displacement in position can also be taken as the average of the amounts of displacements in position at a plurality of arbitrary points in the sub deflection area including the center of the main deflection area. Further, the amount of displacement in position can also be taken as the average of the amounts of displacements in position at a plurality of arbitrary points in the sub deflection area including the centre of the main deflection area and four sub deflection areas that are located therearound.

The processing of Step 302 is performed on a plurality of main deflection areas on a mask. Since it takes time to perform the processing though the accuracy of correction becomes higher as the number of processes increases, the number thereof may be set to a suitable number of processes as the case may be. Correction values are determined from the plural amounts of displacements in position obtained at Step 302 (Step 303).

The processing of Step 302 is performed by measuring the mask already subjected to pattern writing using a measuring unit and calculating the amount of displacement in position from each obtained value. On the other hand, the processing of Step 303 is performed by the pattern writing data decoder 24 shown in FIG. 1. After the determination of each correction value, the pattern writing data decoder 24 successively generates data for positioning subfields, on which the correction values are reflected (Step 304). The thus-obtained data is sent to the main deflector driver 27 and the sub deflector driver 28 respectively.

Then, pattern writing with the electron beam is performed based on the transmitted data (Step 305). Described specifically, a predetermined signal is transmitted from the main deflector driver 27 to the main deflector 15 of the electron beam optical system 10, where the electron beam is deflected and scanned at a designated subfield position. A predetermined sub deflection signal is sent from the sub deflector driver 28 to the sub deflector 16, whereby pattern writing for each subfield is performed.

The pattern writing is performed on its corresponding stripe area while the stage is being moved in the direction of X. Then, the stage is conveyed in steps in the direction of Y and thereafter the pattern writing is performed on the next stripe area. At this time, such a continuous movement system that the stage is moved continuously in the direction of X and the shot position of the electron beam is caused to follow the movement of the stage can be adopted for the movement of the stage. Such a step-and-repeat system that the stage is stopped to perform pattern writing for one main deflection area and no pattern writing is performed when the stage is stepped to the next area can also be adopted therefor.

The step-and-repeat system may preferably be adopted in terms of the enhancement of pattern writing accuracy. When the continuous movement system is taken, it is preferable to write patterns with the width of a main deflection area narrowed. Described in detail, it is preferable to set each main deflection area to a width obtained by combining a first sub deflection area lying in the neighborhood of the center of the main deflection area and two of second sub deflection areas with one located anteriorly and the other located posteriorly in the movement direction of the stage with the first sub deflection area positioned therebetween and thereby perform the irradiation with the electron beam. In doing so, pattern writing can always be performed in the neighborhood of the center of the main deflection area. Incidentally, when the center of the main deflection area lies between the two sub deflection areas, the main deflection area is set to a width obtained by combining these sub deflection areas and sub deflection areas located three or so respectively before and after these sub deflection areas in the direction of movement of the stage. In such a state, the irradiation with the electron beam may preferably be performed.

Figure 9:
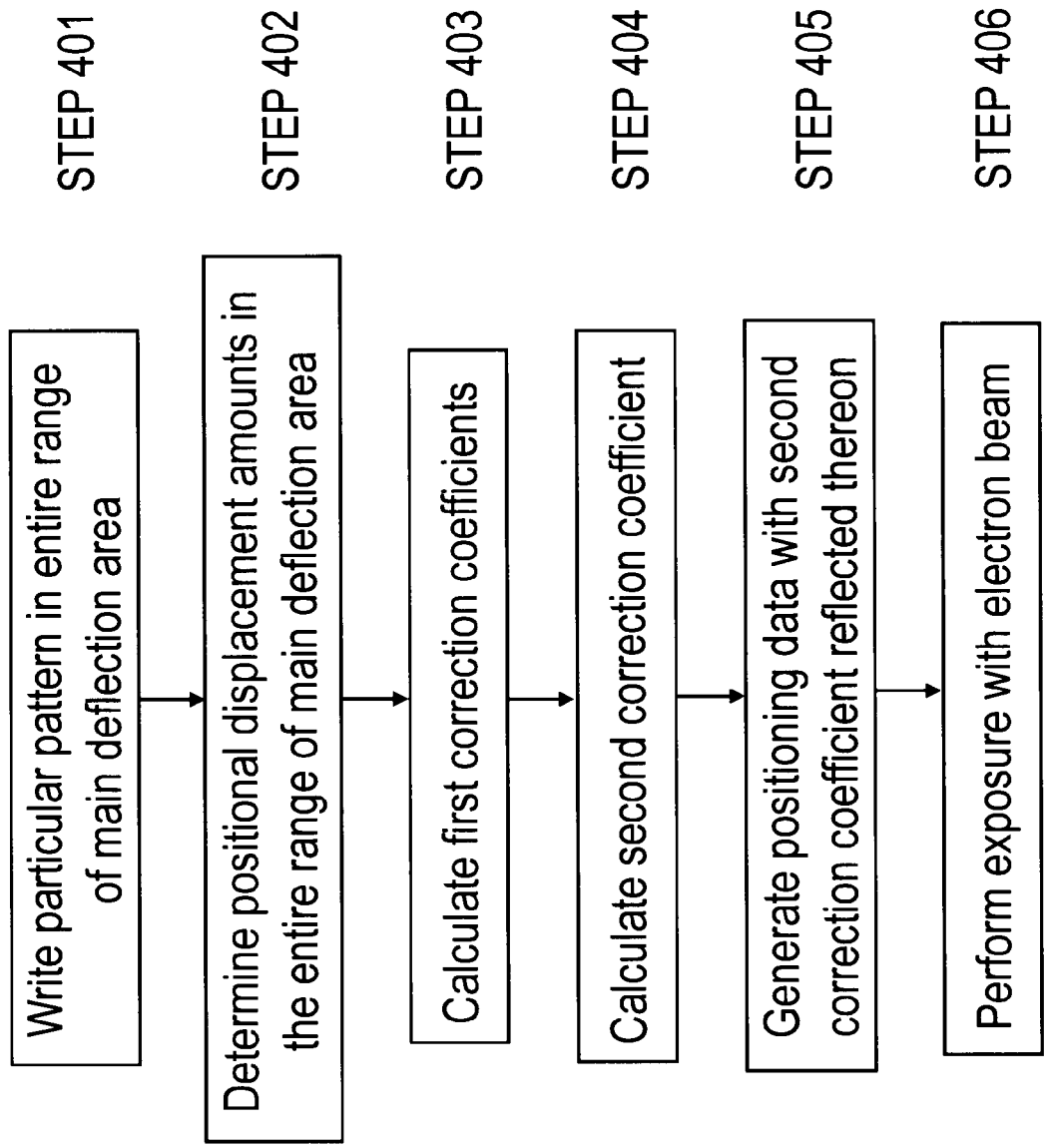
FIG. 9 is another example of a flowchart showing an electron beam writing method according to the present embodiment.

FIG. 9 is an example in which correction values in the entire range of a main deflection area and a correction amount based on those values are determined in order to perform lithographic exposure. This method is effective where large distortion occurs in the shape of the main deflection area.

A specific pattern is first written onto the entire main deflection area of a sample by an electron beam in accordance with the step-and-repeat system (Step 401). Specifically, the same patterns mentioned in the explanation for FIG. 7 (for example, the patterns of FIG. 10) can be used.

Next, the amount of displacement in position between the position irradiated with the electron beam and an ideal irradiation position is determined in the entire range of the main deflection area formed in Step 401 (Step 402).

The processing of Step 402 is performed on a plurality of main deflection areas on a mask. Since it takes time to perform the processing though the accuracy of correction becomes higher as the number of processes increases, the number thereof may be set to a suitable number of processes as the case may be. First correction values are determined from the plural amounts of displacements in position obtained at Step 402 (Step 403).

Next, the average value of the first correction values obtained in Step 403, or a second correction value, is calculated (Step 404). The second correction value is to correct the distortion in the shape of the main deflection area.

The process of Step 402 is performed by measuring the mask already subjected to pattern writing by means of the measuring instrument and calculating the amounts of displacements in position from values obtained by the measurement. On the other hand, the processes of Steps 403 and 404 are performed by the pattern writing data decoder 24 shown in FIG. 1. After the determination of the necessary correction values at these Steps, the pattern writing data decoder 24 continuously generates data for positioning subfields, on which the second correction value has been reflected (Step 405). The thus-obtained data are transmitted to the main deflector driver 27 and the sub deflector driver 28 respectively.

Subsequently, pattern writing or pattern drawing with the electron beam is performed based on the transmitted data (Step 406). Described specifically, a predetermined signal is sent from the main deflector driver 27 to the main deflector 15 of the electron beam optical system 10, where the electron beam is deflected and scanned at a designated subfield position. A predetermined sub deflection signal is sent from the sub deflector driver 28 to the sub deflector 16, whereby pattern writing for each subfield is performed.

According to the method shown in FIG. 9, pattern writing higher in precision than the method shown in FIG. 8 is enabled since the correction values are calculated in the entire range of a main deflector area. Thus, it is possible to perform pattern writing by the continuous movement system with no need to narrow the width of the main deflection area and realize processing at high speed. Also possible is a method in which positional displacement values are obtained at multiple arbitrary points in a main deflection area to determine the first correction values based on those values, and the second correction value, i.e., the average value of the first correction values, is thereafter obtained to correct the position to be irradiated with an electron beam based on the second correction value. This method also enables pattern writing with great precision. In addition, the method can reduce the calculation time, compared with the above case where correction coefficients in the entire range of a main deflection area are obtained, thereby enabling faster correction processing.

As described above, the electron beam writing method according to the present invention is effective particularly for applications that need high-precision pattern writing. That is, the determination of the amount of correction in the neighborhood of the center of each main deflection area makes it possible to reduce the influence of the amount of variation in drift and perform pattern writing with a high degree of precision. Further, higher-precision pattern writing is enabled by correcting the position irradiated with an electron beam using a correction value obtained from positional displacement values in the entire range of a main deflection area or at multiple arbitrary points in that main deflection area. This method is particularly effective where distortion occurs in the shape of the main deflection area.

Incidentally, the present invention is not limited to the above embodiments and may be implemented by making various modifications thereto within the scope not departing from the gist of the present invention. Although the electron beam has been used in the above embodiments, for example, the present invention is not limited to it. The present invention is applicable even to the case in which other charged-particle beam such as an ion beam is used.

The features and advantages of the present invention may be summarized as follows.

According to the first aspect of the present invention, it is possible to suppress the influence due to the amount of variation in drift and thereby realize a high-precision correction.

According to the second aspect of the present invention, even when distortion occurs in the shape of a main deflection area, the influence due to the amount of variation in drift can be suppressed, thereby making it possible to perform a correction with a high degree of precision.

According to the third aspect of the present invention, even when the shape of the main deflection area is distorted, an irradiation position can be corrected in a short amount of time with the influence due to drift variation suppressed.

Obviously many modifications and variations of the present invention are possible in the light of the above teachings. It is therefore to be understood that within the scope of the appended claims the invention may be practiced otherwise than as specifically described.

The entire disclosure of a Japanese Patent Applications No. 2007-183037, filed on Jul. 12, 2007 and No. 2008-151552, filed on Jun. 10, 2008 including specifications, claims, drawings and summarys, on which the Convention priority of the present application is based, are incorporated herein by reference in its entirety.

What is claimed is:

1. A charged-particle beam writing method for deflecting a charged-particle beam using a main deflector and a sub deflector disposed on an optical path of the charged-particle beam and writing a predetermined pattern onto a sample located on a stage, comprising the steps of:

determining positional displacement amounts in the neighborhood of the center of a main deflection area of the charged-particle beam;

determining correction values from a plurality of said positional displacement amounts; and correcting a position to be irradiated with the charged-particle beam using the correction values.

2. The charged-particle beam writing method according to claim 1, wherein the neighborhood of the center of the main deflection area is a sub deflection area including the center of the main deflection area.

3. The charged-particle beam writing method according to claim 2, wherein the positional displacement amount corresponds to one arbitrary point in the sub deflection area.

4. The charged-particle beam writing method according to claim 2, wherein the positional displacement amount is the average of positional displacement amounts at a plurality of arbitrary points in the sub deflection area.

5. The charged-particle beam writing method according to claim 1, wherein the main deflection area is set to a width obtained by combining a first sub deflection area lying in the neighborhood of the center of the main deflection area and two of second sub deflection areas with one located anteriorly and the other located posteriorly in the movement direction of the stage with the first sub deflection area positioned between the two of the second sub deflection areas, and the charged-particle beam is applied thereto to perform continuous pattern writing.

6. The charged-particle beam writing method according to claim 1, wherein a specific pattern is written over the entire main deflection area by the charged-particle beam in accordance with a step-and-repeat system, and the amount of displacement in position between the position irradiated with the charged-particle beam and an ideal irradiation position is determined at a point located in the neighborhood of the center of the main deflection area.

7. The charged-particle beam writing method according to claim 1, wherein a specific pattern is written onto only an area including the neighborhood of the center of the main deflection area by the charged-particle beam in accordance with a continuous movement system, and the amount of displacement in position between the position irradiated with the charged-particle beam and an ideal irradiation position is determined at a point located in the neighborhood of the center of the main deflection area.

8. A charged-particle beam writing method for deflecting a charged-particle beam using a main deflector and a sub deflector disposed on an optical path of the charged-particle beam and writing a predetermined pattern onto a sample located on a stage, comprising the steps of:

determining positional displacement amounts in the entire range of a main deflection area of the charged-particle beam and determining first correction values from said positional displacement amounts;

determining a second correction value, or the average value of the first correction values; and correcting a position to be irradiated with the charged-particle beam using the second correction value.

9. A charged-particle beam writing method for deflecting a charged-particle beam using a main deflector and a sub deflector disposed on an optical path of the charged-particle beam and writing a predetermined pattern onto a sample located on a stage, comprising the steps of:

determining positional displacement amounts at multiple arbitrary points in a main deflection area of the charged-particle beam and determining first correction values from said positional displacement amounts;

determining a second correction value, or the average value of the first correction values; and correcting a position to be irradiated with the charged-particle beam using the second correction value.

\* \* \* \* \*